United States Patent
Conner

(10) Patent No.: US 7,174,279 B2
(45) Date of Patent: Feb. 6, 2007

(54) TEST SYSTEM WITH DIFFERENTIAL SIGNAL MEASUREMENT

(75) Inventor: George W. Conner, Camarillo, CA (US)

(73) Assignee: Teradyne, Inc., Boston, MA (US)

( * ) Notice: Subject to any disclaimer, the term of this patent is extended or adjusted under 35 U.S.C. 154(b) by 6 days.

(21) Appl. No.: 10/813,712

(22) Filed: Mar. 31, 2004

(65) Prior Publication Data

US 2005/0222821 A1   Oct. 6, 2005

(51) Int. Cl.
*G06F 15/00*   (2006.01)
(52) U.S. Cl. ....................... 702/189; 324/527
(58) Field of Classification Search ............ 702/57–58, 702/64–66, 120, 124, 182, 189; 324/522–525, 324/527, 763–765, 605–606; 327/335, 530, 327/547, 563, 560–561; 330/252–253, 261
See application file for complete search history.

(56) References Cited

U.S. PATENT DOCUMENTS

| | | | | |
|---|---|---|---|---|
| 4,053,844 A * | 10/1977 | Hamaoui | ........................ | 330/2 |
| 4,547,727 A * | 10/1985 | Tsui et al. | ................ | 324/76.47 |
| 5,294,791 A * | 3/1994 | Pahr | ........................... | 250/548 |
| 5,661,713 A * | 8/1997 | Honma | ..................... | 369/59.17 |
| 5,729,145 A * | 3/1998 | Blades | ........................ | 324/536 |
| 6,424,927 B1 * | 7/2002 | Sechi et al. | .................. | 702/126 |
| 6,504,409 B1 * | 1/2003 | Laletin | ........................ | 327/175 |
| 6,587,814 B1 * | 7/2003 | Warburton et al. | ......... | 702/190 |
| 6,597,731 B1 * | 7/2003 | Shuholm | ..................... | 375/220 |
| 6,640,193 B2 * | 10/2003 | Kuyel | ....................... | 702/69 |
| 6,759,864 B2 * | 7/2004 | Patel | .......................... | 324/765 |
| 6,812,803 B2 * | 11/2004 | Goergen | ........................ | 333/1 |
| 6,865,500 B1 * | 3/2005 | Variyam et al. | ............ | 702/117 |

OTHER PUBLICATIONS

J973 Programming Guide, Chapter 12 Characterizing Devices. 560-923-37, Revision A, pp. 1-30.

* cited by examiner

*Primary Examiner*—Edward Raymond
*Assistant Examiner*—Mary Catherine Baran
(74) *Attorney, Agent, or Firm*—Wolf, Greenfield & Sacks, P.C.

(57) ABSTRACT

A test system with easy to fabricate hardware to make measurements on differential signals. The two legs of a differential signal are applied to a comparator. A variable bias is introduced into the comparison operation. By taking multiple measurements with different bias levels, the level of the differential signal may be determined. The time of measurements relative to the start of the signal can be varied to allow plots of the signal to be made. Variability of the signal caused by noise can be measured by collecting sets of data points with the same bias level at the same relative time. Circuitry for introducing bias into the comparison is disclosed that allows measurements to be made with a prepackaged, commercially available high speed comparator.

24 Claims, 5 Drawing Sheets of test equipment, such as is sold by Teradyne, Inc. of Boston, Mass. Digital signal $S_{in}$ is applied to the input of differential amplifier 116.

TEST SYSTEM WITH DIFFERENTIAL SIGNAL MEASUREMENT

BACKGROUND OF INVENTION

1. Field of Invention

This application relates to test equipment and more specifically to test equipment measuring characteristics of differential electrical signals.

2. Discussion of Related Art

There is often a need to measure various parameters of electrical signals. For example, in the manufacture of semiconductor devices, it is desirable to measure parameters of the signals produced by those devices to verify that the devices are operating properly. Information obtained through testing can be used to identify and discard devices that fail to exhibit the expected performance. Test results can sometimes be used to alter the steps in the process used to make the devices. The devices might, for example, be calibrated in subsequent process steps so that they do exhibit expected performance or the devices might be packaged for sale as parts that meet relaxed performance specifications. Alternatively, the results of tests might also be used in a yield enhancement system to change parameters of processing equipment.

As the performance of semiconductor devices has increased, the difficulty of testing those devices has increased. Electronic systems have come to operate at faster and faster speeds. Also, it has become more prevalent to use low voltage differential signals for fast signals. For example, USB 2.0 and Firewire are serial protocols that employ very fast differential signals. Accurately measuring parameters of fast signals, particularly low voltage differential signals, is a challenge.

Reducing the cost of circuitry that can accurately measure a range of differential values of fast signals over a wide bandwidth range is particularly challenging. One example where such test equipment would be desirable is in measuring the "eye pattern" of differential signals. FIG. 1 shows a circuit used for measuring the eye pattern of a differential signal.

Differential signal $S_{in}$ is applied as an input to test equipment 100. Test equipment 100 could be automatic test equipment, such as is sold by Teradyne, Inc. of Boston, Mass. Digital signal $S_{in}$ is applied to the input of differential amplifier 116.

Differential signal $S_{in}$ has two legs, $S_{in+}$ and $S_{in-}$. The signal is represented as the difference in voltage on these legs. The output of the differential amplifier 116 is a single ended analog signal representing the difference in voltage on legs $S_{in+}$ and $S_{in-}$.

The output of differential amplifier 116 is applied to HI-LO comparator 110. HI-LO comparator 110 contains two digital outputs, $OUT_{HI}$ and $OUT_{LO}$. $OUT_{HI}$ is asserted when the input to comparator 110 is above a threshold established by input $V_{comp+}$. $OUT_{LO}$ is asserted when the input to comparator 110 is below a threshold established by input $V_{comp-}$. The comparison is made when the strobe input to the comparator 110 is asserted.

The values of $V_{comp+}$ and $V_{comp-}$ are set by control logic 120. The time at which the strobe input is asserted is controlled by timing generator 118, which is also controlled by control logic 120. In automatic test equipment, control logic 120 might include a combination of special purpose hardware and a general purpose digital computer. Operation of control logic 120 can be controlled by software programming.

$OUT_{HI}$ and $OUT_{LO}$ are provided to data analysis circuitry 122. Data analysis circuitry 122 represents a combination of special purpose hardware, such as memories that capture data generated at a high rate, and general purpose computer processors that can be programmed to perform a desired function. Data analysis may be performed on the same computer that is part of control logic 120. In the example of FIG. 1, data analysis circuitry 122 is programmed to produce a plot depicting an eye pattern of a differential signal.

FIG. 2A shows, in idealized form, a differential signal. The legs $S_+$ and $S_-$ are shown separately, with the magnitude of the signal represented by the difference between $S_+$ and $S_-$. FIG. 2A shows a periodic digital signal oscillating between a state representing a logic HI and a state representing a logic LO. Region $E_1$ represents a "rising edge" transition and region $E_2$ represents a "falling edge" transition in an interval denoted $P_1$. Regions $E'_1$ and $E'_2$ represent the rising edge transition and the falling edge transition of a subsequent interval $P_2$.

As shown in the idealized waveform of FIG. 2A, the voltages on the legs $S_+$ and $S_-$ have well defined values outside the transition regions, resulting in a relatively large voltage, $V_{pp}$, representing the signal. There is a relatively long interval $P_M$, during which the signal has sufficient magnitude that a reliable measurement can be made to determine if the signal is HI or LO.

FIG. 2B illustrates a portion of an actual differential signal. The portion pictured in FIG. 2B corresponds to the portion in interval $P_1$ in FIG. 2A. FIG. 2B represents the impact of noise on the signal. Also, FIG. 2B indicates the impact of rise and fall time limitations of the electronic circuitry that generates and transmits the signal. The transitions are not as crisp as shown in FIG. 2A. The overall result is that both the peak voltage, $V_{pp}$, and that the interval $P_M$, over which the state of the signal can be reliably measured are decreased.

FIG. 2B is sometimes called an "eye pattern." Understanding the shape of the eye pattern is important for designing circuits that operate on the differential signal. For example, the magnitude of $V_{pp}$ indicates the amount of noise that can be added to the signal before improper operation is likely to result. The interval $P_M$, indicates the timing precision required to accurately read the signal. Thus, in testing or characterizing semiconductor devices, it is often important to know the eye pattern of the signals produced by the semiconductor device.

FIG. 2C represents plots of measurements that can be made with test system 100 (FIG. 1) from which characteristics of the eye pattern can be observed. The plot is made according to a technique sometimes referred to as an "edge sweep." The signal to be plotted is applied to the input of test system 100. The strobe signal is timed so that the measurement occurs at a controlled time relative to the start of the interval. The strobe signal causes comparator 110 to compare the input signal to one of its reference values, such as $V_{comp+}$.

The output of the comparator is a data point indicating whether the input signal, at the time determined by the strobe signal, exceeds $V_{comp+}$. If, at the strobe time, the input signal has a value below the value set for $V_{comp+}$, the output of the comparator will be a logic LO. If the input signal is above the value set for $V_{comp+}$, the output of the comparator will be a logic HI at every cycle. Thus, the output of the comparator gives a very course indication of the value of the signal at one instant in time.

If the measurement is repeated with different values of $V_{comp+}$, it is possible to find some value of $V_{comp+}$ at which the output of comparator 110 is HI and another, slightly larger value of $V_{comp+}$ at which the output of comparator 110 is LO. At the time determined by the strobe signal, it could be determined that the value of the signal $S_{in}$ is between these two values of $V_{comp+}$.

The same process can be repeated with the timing of the strobe signal changed in each repetition to collect data points at different times relative to the start of the interval. By taking data points for a sufficient number of strobe times, the value of the signal can be plotted over the entire interval.

To capture the effects of noise, a set of data points for the same strobe time and value of $V_{comp+}$ must be collected. The test equipment must be configured so that each measurement is made at the same time relative to the start of an interval so that the data points in the set can be averaged. For a signal as shown in FIG. 2A with a repetitive pattern of intervals, the strobe signal can be set to take a measurement during each repetition of the pattern. For example, for the signal in FIG. 2A, a measurement could be made during interval $P_1$, $P_2$, etc. Each measurement is made with the same timing relative to the start of its interval.

Because of the effects of noise, the signal $S_{in}$ might at any time take on any value in a range of values. As a result, not all of the data points taken with the same value of $V_{comp+}$ and the same strobe time will have the same value. However, the measurements provide information about the signal because, as the value of $V_{comp+}$ changes, the percentage of data points with a HI or LO value will change. For example, a set of data points taken with $V_{comp+}$ well below this range of values will have nearly 100% of the data points with a HI value. A set of data points taken with value $V_{comp+}$ well above this range of values will have nearly 100% of the data points with a LO value. A set of data points taken with $V_{comp+}$ within this range of values will have a mix of HI and LO values, with the relative percentages an indication of the proximity of the value of $V_{comp+}$ to either the top or bottom of the range.

Therefore, a top and bottom and top of the range of signal values can be identified by finding the data sets in which slightly less than 100% of the data points are HI or 100% of the data points are LO. The values of $V_{comp+}$ used to gather the data points within these data sets define the range boundaries. The value of the signal, including the effects of noise, can be represented at any given time by the bottom and the top of the range.

FIG. 2C depicts a series of four plots that are made by this method. Plots $L_1$ and $L_2$ are made with data taken during rising edges of the signal, such as $E_1$ and $E'_1$. Plots $L_3$ and $L_4$ are with data taken during a falling edges, such as $E_2$ and $E'_2$. Plots $L_2$ and $L_3$ define the lower end of the range. Plots $L_1$ and $L_4$ defined the higher end of the range.

Plots $L_2$ and $L_3$ and plots $L_1$ and $L_4$ are not shown to be connected. FIG. 2C shows only the data collected during times corresponding to rising or falling edges of the signal. Similar data for the entire interval could be collected and presented, in which case the plots $L_2$ and $L_3$ and plots $L_1$ and $L_4$ would appear connected.

The plots $L_1$, $L_2$, $L_3$ and $L_4$ include both positive and negative values because a "rising edge" could represent a LO to HI transition of the signal, such as is depicted at $E_1$ or a HI to LO transition, such as depicted at $E'_1$.

While making a plot such as shown in FIG. 2C is desirable, constructing a differential amplifier such as 116 for use in a test system can be difficult and expensive. To make an accurate measurement on the signal, the amplifier must output an accurate representation of the input signal. The amplifier must have a precisely controlled gain over a broad range of operating frequencies.

SUMMARY

In one aspect, the invention relates to a method of performing a measurement on a differential signal in which each leg of the differential signal is provided to an input of a comparator having at least a first and second input. A plurality of bias levels are introduced into the comparison, whereby the output of the comparator is a first logical value when the value at the first input exceeds the value at the second input by the bias level. A plurality of sets of samples of the output of the comparator are taken, with a set of samples for each of the bias levels and each of the samples in each of the sets is correlated in time to a point on the waveform. A set of samples having values with a predetermined percentage of a predetermined logical value is selected. The bias value used to take the samples in the selected set is associated with the value of the differential signal at the point on the waveform.

In another aspect, the invention relates to an automatic test system suitable for making measurements of a differential signal applied as an input to the test system. The test system has measurement circuitry that includes a comparator. The comparator has a first and second signal input terminals and an output providing a logical signal indicating the results of a comparison. A timing input to the comparator controls the time at which a comparison is made. The measurement circuit also includes means for biasing the comparison by a variable amount in response to a control signal and control circuitry that provides a timing signal connected to the timing input of the comparator and a control signal to the means for biasing. The test system also includes data analysis circuitry having an input coupled to the output of the comparator, the data analysis circuitry determining parameters of the differential signal from the output of the comparator.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
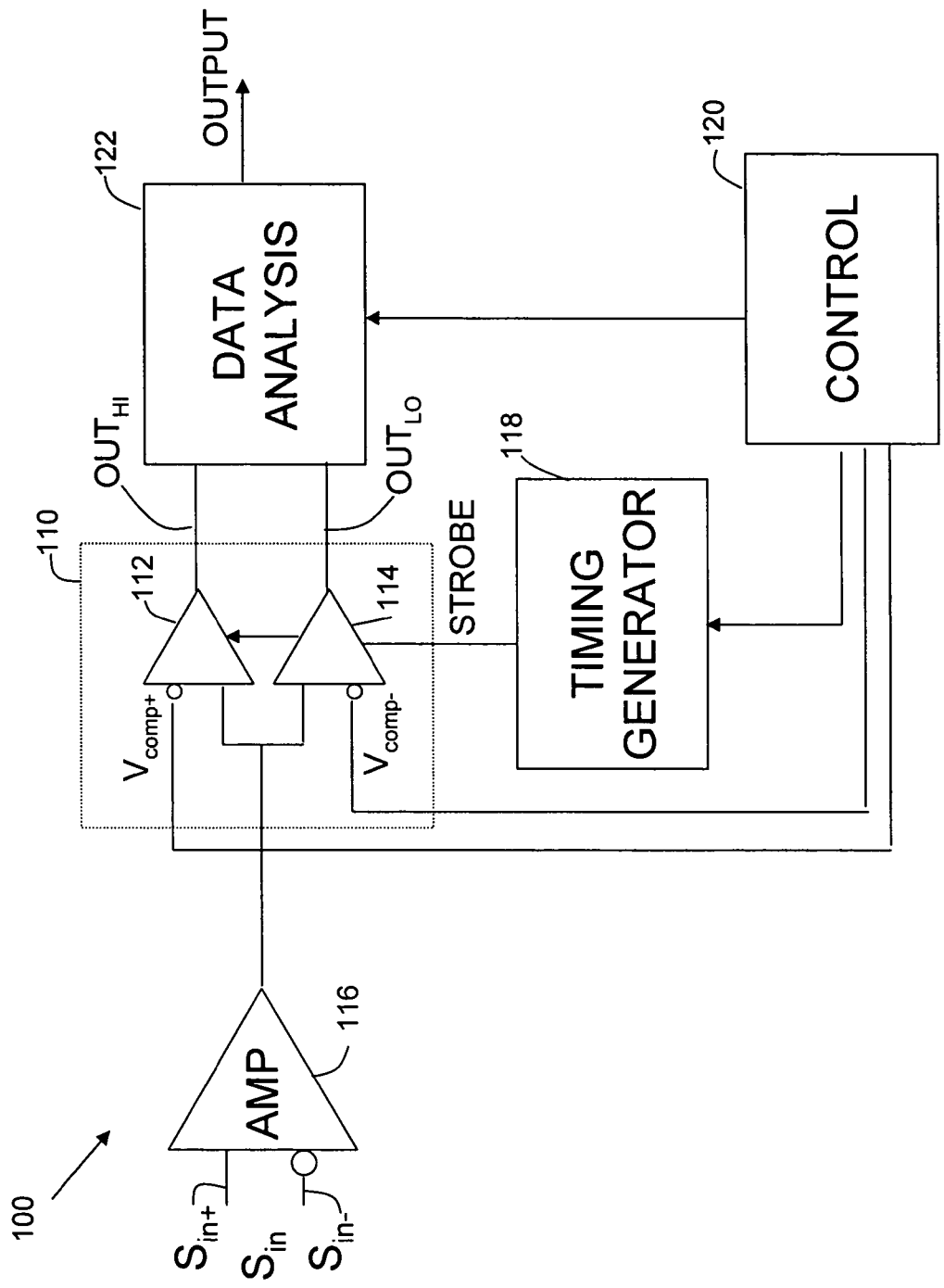
FIG. 1 is a block diagram of a prior art test system.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Figure 3:
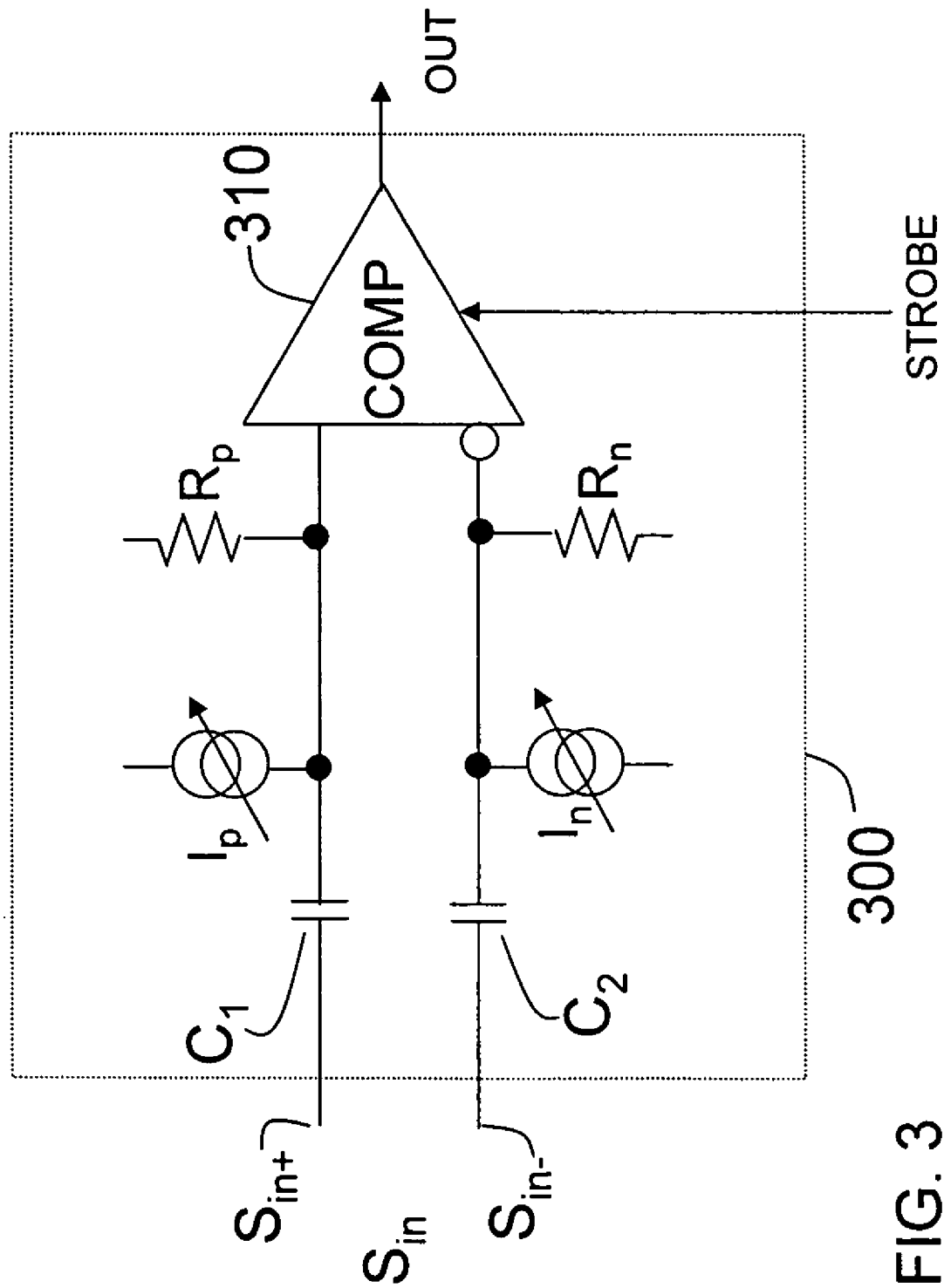
FIG. 3 is a diagram illustrating a comparator that can be used in measuring parameters of differential signals.

FIG. 3 shows a circuit 300 that can be used in place of comparators 110 and differential amplifiers 116. Circuit 300 has an input connected to $S_{in}$. An output, OUT, can be connected to data analysis circuit 122 (FIG. 1). Timing of operation of the circuit 300 is controlled by a STROBE signal from timing generator 118 (FIG. 1).

Circuit 300 includes a comparator 310. Comparator 310 may be a comparator such as either of comparators 112 or 114 as in the prior art. Preferably, comparator 310 is a high bandwidth comparator. The bandwidth should preferably be sufficient to operate on signals having frequencies in excess of 5 Gbits per second. In one presently contemplated embodiment, comparator 310 is a commercially available receiver designed for high speed serial signals. An example of a suitable part is TRCV0110 10 Gbit receiver sold by Agere Semiconductor.

Circuitry 300 is used to perform an edge sweep as in the prior art. Multiple data sets are taken at times dictated by the STROBE signal. The output of comparator 310 indicates whether the input signal $S_{in}$ had a value above or below some reference voltage at the strobe time. However, rather than convert the input differential signal through a single ended value and compare this value to a reference level, circuit 300 compares the relative levels of the two legs of the input signal, $S_{in+}$ and $S_{in-}$ with a bias introduced in the comparison.

Figure 2A:
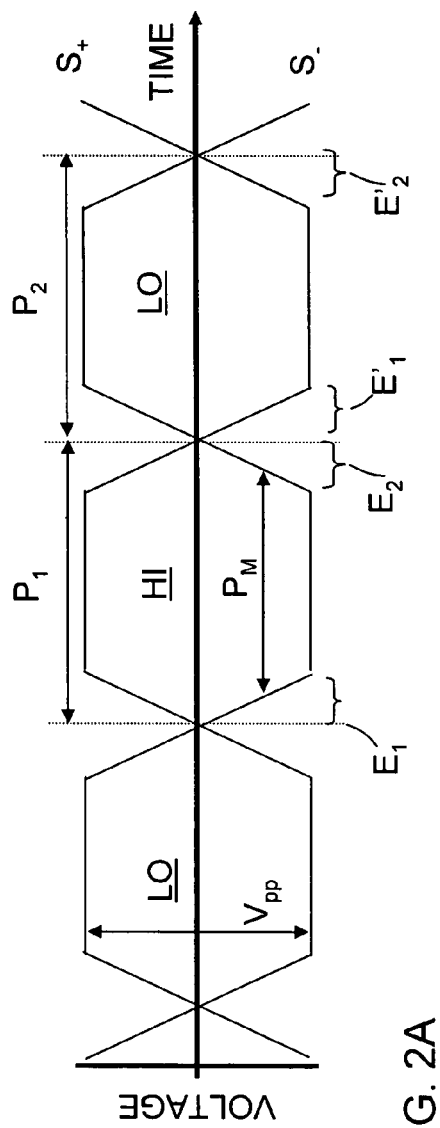
FIGS. 2A, 2B and 2C are sketches useful in understanding measurement of parameters of differential signals.
Figure 2B:
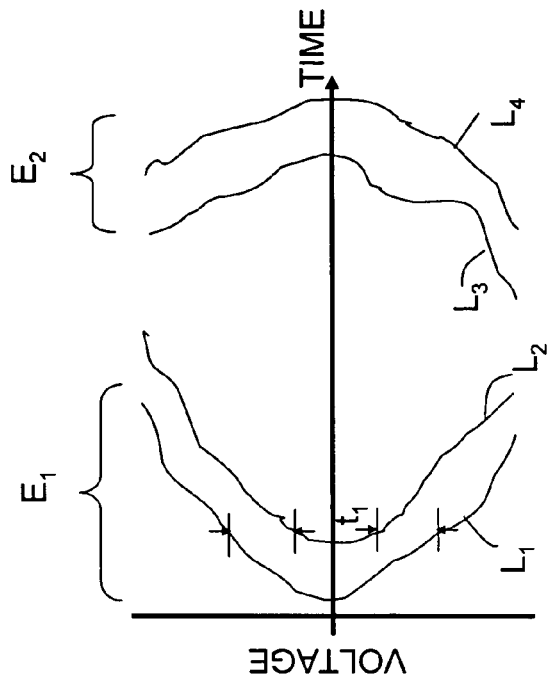
Figure 4A:
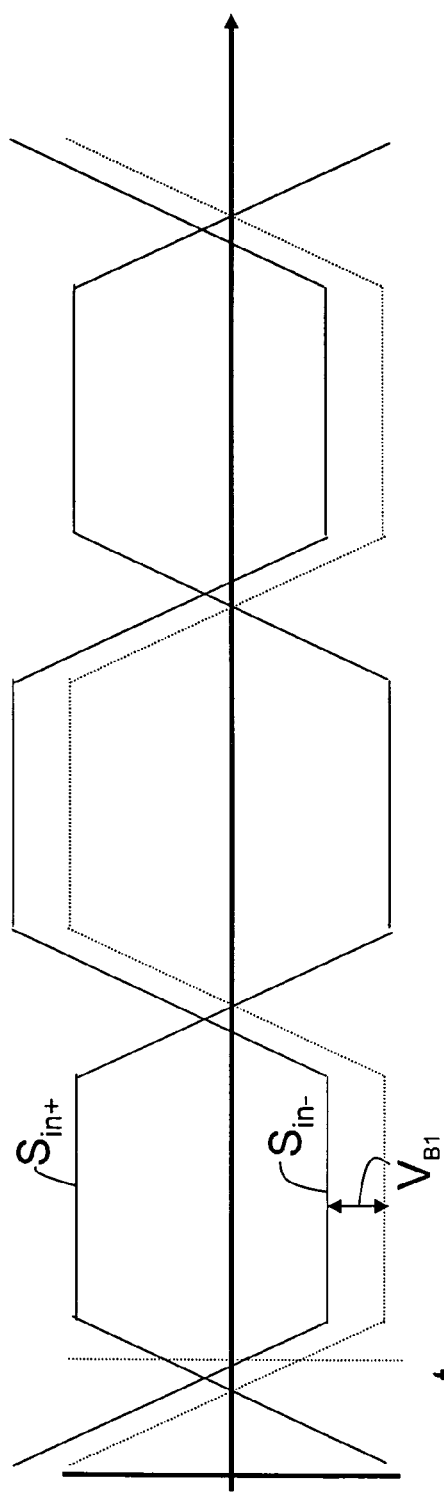
FIGS. 4A and 4B are sketches useful in understanding operation of the comparator of FIG. 3.
Figure 4B:
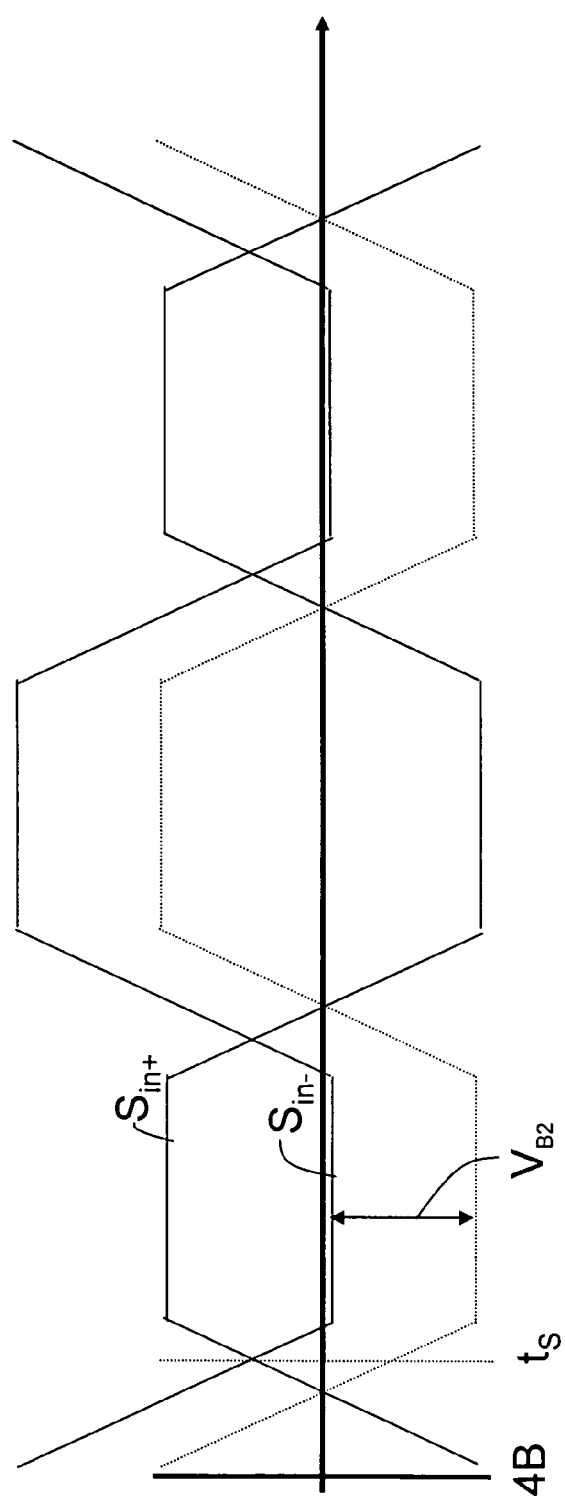

FIGS. 4A and 4B illustrate how the introduction of a bias allows comparator 310 to indicate the value of a differential signal. FIGS. 4A and 4B represent idealized differential signals in the format pictured in FIG. 2A. However, the principals of operation apply equally to a differential signal with noise, such as is illustrated in FIG. 2B.

FIG. 4A shows that the signal $S_{in-}$ has been offset by an amount $V_{B1}$. $V_{B1}$ represents the bias that has been introduced by circuit 300. As shown in FIG. 4A, at Time $t_s$, the value of $S_{in-}$ is less than the value of $S_{in+}$ even with the bias voltage applied. With the bias condition of FIG. 4A, the output of comparator 310 will be a logical low signal.

Figure 2C:
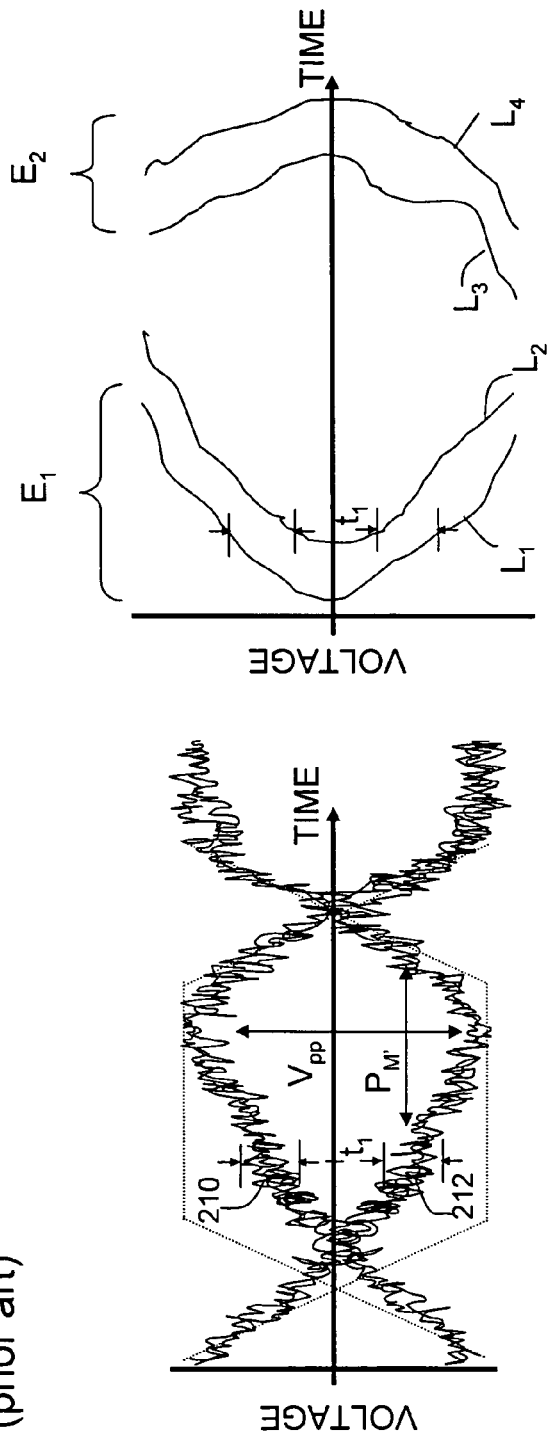

FIG. 4B illustrates signal $S_{in}$ with a greater bias applied. In FIG. 4B, the signal on leg $S_{in-}$ has been offset by an amount $V_{B2}$. With this level of bias, at time $t_s$, the value of $S_{in-}$ is greater than the value of leg $S_{in+}$. In this condition, the output of comparator 310 will be a logic LO. The amount of bias voltage that must be added to make the signals in the two legs equal is an indication of the difference between $S_{in-}$ and $S_{in+}$. By finding the value of the bias voltage at which the output of comparator switches from a logic HI to a logic LO, the level of the differential signal, $S_{in}$, can be ascertained.

Where noise is present, multiple samples of the signal $S_{in}$ taken at the same strobe time with the same bias level will have a range of values. The percentage of points in a data set being HI or LO is an indication of where in the range the bias level falls. As in the prior art, the lower end of the range and the upper end of the range can be established by setting a limit on the percentage. For example, one end of the range might be bounded by the bias voltage used to create the data set with 90% HI values and the other end of the range might be bounded by the bias voltage used to create the data set with 90% LO values. By identifying boundaries on the range of values $S_{in}$ might have, a plot such as shown in FIG. 2C can be constructed.

Returning to FIG. 3 a convenient mechanism for applying a bias voltage is illustrated. As shown in FIG. 3, the input signal $S_{in}$ is AC coupled to circuit 300. AC coupling is achieved in the illustrated embodiment through the use of blocking capacitors $C_1$ and $C_2$. Use of AC coupling allows a DC bias to be imposed at the inputs of comparator 310 without altering the performance of upstream circuitry that generates $S_{in}$.

In the circuit illustrated in FIG. 3, a DC bias is introduced at the inputs of comparator 310 using a current source coupled to a resistor. Current source $I_P$ injects a controlled amount of current at the positive input of comparator 310. This current is dissipated through resistor $R_P$ to develop a voltage across the resistor equal to $I_P R_P$. Likewise, a variable current source $I_N$ is connected to the negative input of comparator 310. That current passes through resistor $R_N$ to develop a voltage at the negative input of comparator 310 equal to $I_N R_N$. The bias voltage is the difference between these values. This configuration allows either a positive or negative bias voltage to be created.

The circuit configuration of FIG. 3 has the advantage of allowing a bias to be introduced in the comparison operation performed by comparator 310 without requiring access to the internal nodes of comparator 310. Introducing a bias without accessing the internal nodes of comparator 310 allows a commercially available part to be used as comparator 310. Using commercially available parts reduces the cost of constructing the test instrument.

Figure 5:
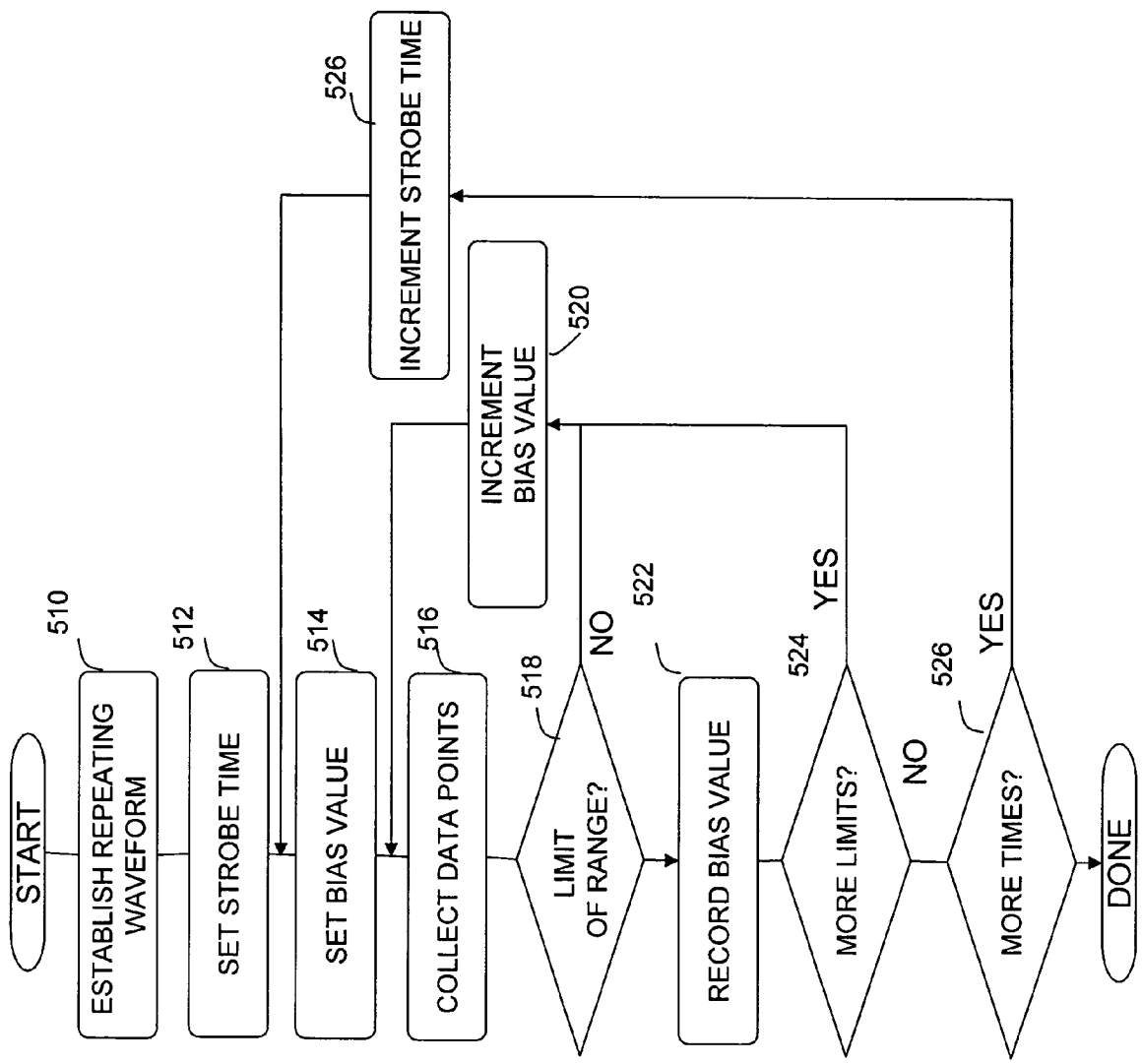
FIG. 5 is a flow chart illustrating a method of measuring parameters of differential signals.

Turning now to FIG. 5, a flow chart of a process for forming a plot as shown in FIG. 2C is illustrated. The process begins at step 510. As in the prior art, a repeating waveform is established. A repeating waveform might be established by providing multiple periods of a repetitive waveform or by triggering a circuit to repetitively generate the same waveform.

At step 512, the time of the signal STROBE is set to cause comparator 310 to take samples at a specific time relative to the start of the interval for which data points are to be collected. In the preferred embodiment, the STROBE time will initially be set to cause data points to be collected at the start of the interval.

At step 514, an initial bias value is set. In the example shown in FIG. 5 the initial bias value is set at its most negative value. Where the circuit of FIG. 5 is used, the most negative value of bias voltage is set by setting $I_P$ to its maximum value and $I_N$ to its minimum value.

At step 516 a set of data points is collected for the value of strobe time set at step 512 and bias voltage set at step 514. The number of data points in the set collected at step 516 is not critical. However, sufficient data points should be collected to allow the statistical properties of the data points collected to provide a reliable indication of the statistical properties of the noise in the signal.

At step 518 a check is made whether the data points collected at step 516 represent a limit on the range of values of $S_{in}$ for that strobe time. Various ways might be used to identify a limit of the range. One simple way is to identify a lower limit when the output of comparator 310 has 90% HI values and 10% LO values. The upper limit of the range might be identified when the data points collected at step 516 include 90% LO values and 10% HI values.

If at step 518, a range limit is identified, processing proceeds to step 522 where the bias value applied when the data points were collected is recorded. The recorded value represents the value of the input signal at this limit. Conversely, if at step 518 it is determined that the data points collected at step 516 do not correspond to a limit of a range, processing proceeds to step 520.

At step 520, the bias value is increased a small amount. The size of the increment in bias value dictates the resolution of the measurements on signal $S_{in}$. Smaller increments will result in higher resolution measurements. However, smaller increments will increase the total amount of time to perform the test shown in FIG. 5.

With the new bias value applied at step 520, processing loops back to step 516. At step 516, another set of data points is collected. This set of data points is examined at step 518 to determine whether it represents a limit of the range of values of $S_{in}$. Where the data points corresponds to a limit of the range, processing proceeds to step 522 where the bias value applied when those data points were collected is recorded.

At step 524 a check is made whether more data points need to be collected to identify further limits. As shown in FIG. 2C, each time has potentially four limits associated with it. There is potentially one lower and one upper limit for a LO to HI transition and separate limits, of opposite polarity, for a HI to LO transition. If further limits remain to be detected, processing again loops back to step 520 where the bias value is incremented. Processing continues to loop back through step 520 to step 516 where sets of data points are collected until no further data is needed to identify all of the limits of interest. Where no further limits of interest exist for a particular time, processing proceeds to step 526.

At step 526, a check is made whether limits need to be identified for this signal $S_{in}$ at other times. For example, when the process of FIG. 5 is being used to trace out the upper and lower boundaries of a rising edge, values are collected for times that span the range $E_1$ shown in FIG. 2C. Where data values are collected for a falling edge, strobe times span the interval represented by $E_2$ in FIG. 2C. Where further times are required to span the interval of interest, processing proceeds to step 526 where the strobe time is incremented. Processing then loops back to step 514.

At step 514 the bias value is set again to its most negative value and the process of collecting data to identify the limits of the range of the signal is repeated for the strobe time set at step 526. In this way, values needed to trace out the plots $L_1$, $L_2$, $L_3$ and $L_4$ as shown in FIG. 2C can be obtained.

Data analysis 122 circuit (FIG. 1) presents these values in a format that depends on the intended use of them. For example, the measured parameters might be presented graphically as an eye pattern for the signal through some user interface. Alternatively, single valued parameters, such as $V_{pp}$ or $P_M$, might be presented. The specific format for presenting the results of measurements will depend on the use of the information. If the information is presented for use by a human user, a graphical form might be used. Where the information is provided to other automated equipment used in the process of making semiconductors, numerical form might be used.

Regardless of the exact use of the measured parameters, the approach described above provides a low cost method for measuring parameters of a differential signal.

Having thus described several aspects of at least one embodiment of this invention, it is to be appreciated various alterations, modifications, and improvements will readily occur to those skilled in the art.

For example, measurement of parameters of differential signals was described in connection with the measurement of the eye pattern of the signal. However, other parameters might be measured with the method described herein.

Also, FIGS. 4A and 4B show that introducing a bias changes the level of the signal on leg $S_{in-}$ while the level of $S_{in+}$ is unchanged. Because the signal is shown as a differential signal, the absolute level of each leg is not important. A bias could be introduced by increasing the level of one leg of the signal, decreasing the level of the other leg of the signal or some combination of both. And, because the absolute level of a differential signal is not important, the voltage level corresponding to the X-axis in FIGS. 4A and 4B is not significant.

The tests are described as performed by automatic test equipment. The circuitry and methods described herein could be incorporated in bench-top test equipment or in other devices. In one contemplated embodiment, the circuitry described herein is part of an instrument that might be added to a piece of automatic test equipment when measurements on differential signals are desired.

Also, it was described that certain circuit elements operate on logical HI or logical LO signals. These terms are not intended to imply any specific electrical properties. Rather, they are intended to indicate that the signals take on values that allow their state to be recognized.

FIG. 5 depicts a method involving repetitive measurements, with two parameters being varied iteratively. The order in which the parameters are varied is not important. As pictured, the voltage is first varied iteratively until a desired value is observed. The strobe time is then altered and the voltage is again varied. However, similar results could be obtained by incrementing the strobe time for a set voltage until a desired value is observed. Then the voltage might be changed and iterations of the strobe time repeated until the desired value is again observed.

Further, FIG. 5 shows measurements in which parameters, such as the strobe time and the bias level, take on a range of values. In each case, the parameter is initially set to its lowest value and incremented to take further measurements with different values of the parameter. Starting with the smallest value of the parameter is generally desirable because it provides an easy way to organize the data, but the measurements can be taken by varying the parameters in any manner.

Also, the discussion in connection with FIG. 5 described that limits were identified by identifying a data set where the percentage of data points having a specific logical value might exceeded a certain percentages. More complex approaches to identifying a limit might be used. For example, the limit might be identified where the moving average taken over several data sets with different bias levels exceeds some threshold. Also, it is not necessary that the limit of the range be identified before further data points are collected. As one alternative, data sets for all possible bias values might be collected and then subsequently processed to identify those sets that correspond to limits.

Further, FIG. 3 illustrates a circuit in which a bias is introduced into the signals being measured. Such an approach is particularly desirable where the comparator is part of a previously constructed integrated circuit that is encapsulated in a package. Where a previously designed comparator is not used, the comparator may be designed to introduce the required bias.

Such alterations, modifications, and improvements are intended to be part of this disclosure, and are intended to be within the spirit and scope of the invention. Accordingly, the foregoing description and drawings are by way of example only.

What is claimed is:

1. A method of performing a measurement on a differential signal, comprising:
    a) providing each leg of the differential signal to an input of a comparator having at least a first and second input;
    b) introducing a plurality of bias levels into the comparison, whereby the output of the comparator has a logical value representative of a value at the first input compared to a value at the second input offset by the bias level;

c) taking a plurality of sets of samples of the output of the comparator, with a set of samples for each of the bias levels, each of the samples in each of the sets correlated in time to a point on the waveform;

d) selecting a set of samples based on the percentage of samples in the set having a first logical value; and e) associating the bias value used to take the samples in the selected set with the value of the differential signal at the point on the waveform.

2. The method of claim 1 wherein introducing a bias level comprises passing a current through a resistor connected to one of the first and second inputs of the comparator.

3. The method of claim 1 wherein introducing a plurality of bias levels comprises passing a first current through a first resistor connected to the first input of the comparator and passing a second current through a second resistor connected to the second input of the comparator, with the plurality of bias levels introduced by altering the relative level of the first current and the second current.

4. The method of claim 2 wherein the comparator is contained inside a commercially available component having leads accessible at its exterior, including exterior leads coupled to the first and second inputs of the comparator.

5. The method of claim 4 wherein the resistor is outside the commercially available component and coupled to an input of the comparator.

6. The method of claim 2 wherein each leg of the differential signal is AC coupled to one of the first and second inputs to the comparator.

7. The method of claim 1 wherein introducing a bias level comprises altering the operating characteristics of the comparator.

8. The method of claim 1 wherein the comparator is contained inside a commercially available component having leads accessible at its exterior, including exterior leads coupled to the first and second inputs of the comparator and introducing a bias level comprises applying an electrical signal to at least one of the leads coupled to the first and second inputs of the comparator.

9. The method of claim 1 wherein the differential signal has a plurality of rising edges and taking samples correlated in time to a point on the waveform comprises setting strobe times at which the comparator takes samples to be at a predetermined time relative to the start of a rising edge.

10. A method of manufacturing a semiconductor component incorporating the method of claim 1 wherein the differential signal is an output of the semiconductor component at a stage in its manufacture and steps b) through e) of claim 1 are repeated to associate values with a plurality of points on the differential signal.

11. The method of claim 10 wherein the method of manufacturing the semiconductor component comprises:

performing an analysis of the semiconductor component using the values associated with the plurality of points on the differential signals; and selecting at least one step in the manufacturing process in response to the analysis.

12. A method of making semiconductor devices using the method of claim 1, the process comprising:

a) connecting a semiconductor device under test to a test system;

b) stimulating the device under test with signals from the test system;

c) providing a differential signal generated by the device under test to the test system and performing, with the test system, the steps of claim 1 to provide parameters of the differential signal;

d) adjusting the manufacturing process for making semiconductor devices based on the parameters of the differential signal.

13. The method of making semiconductor devices of claim 12 wherein adjusting the manufacturing process comprises speed binning the device under test.

14. An automatic test system suitable for making measurements of a differential signal applied as an input to the test system, the test system having a measurement circuit comprising:

a) a comparator having:
  i) a first and second signal input terminals
  ii) an output providing a logical signal indicating the results of a comparison; and
  iii) a timing input controlling the time at which a comparison is made;

b) means for biasing the comparison by a variable amount in response to a control signal;

c) control circuitry providing a timing signal connected to the timing input of the comparator and a control signal to the means for biasing; and d) data analysis circuitry having an input coupled to the output of the comparator, the data analysis circuitry determining parameters of the differential signal from the output of the comparator.

15. The automatic test system of claim 14 wherein the input terminals of the comparator are AC coupled to the input of the test system and the means for biasing the comparison comprises at least one voltage source coupled to at least one of the first and second input terminals of the comparator.

16. The automatic test system of claim 15 wherein the voltage source comprises a current source and a resistor with the resistor connected to the current source and an input terminal of the comparator.

17. The automatic test system of claim 15 wherein the comparator is enclosed in semiconductor packaging with the first and second input terminals accessible through leads on the outside of the package.

18. The automatic test system of claim 17 wherein the comparator is part of a commercially available semiconductor component.

19. The automatic test system of claim 18 wherein the commercially available semiconductor component comprises a differential receiver.

20. The automatic test system of claim 19 wherein the commercially available semiconductor component comprises a Gigabit receiver.

21. The automatic test system of claim 14 wherein the comparator is a portion of an instrument installed in the automatic test system.

22. The automatic test system of claim 14 wherein the test system includes the timing generator and the control circuitry comprises the timing generator.

23. The automatic test system of claim 14 wherein the data analysis circuit comprises a general purpose computer programmed to determine parameters of the differential signal.

24. The automatic test system of claim 23 wherein the data analysis circuit comprises a user interface through which the eye pattern of the differential signal is displayed.

* * * * *